(12) United States Patent
Khlat (10) Patent No.: US 10,938,350 B2
(45) Date of Patent: Mar. 2, 2021

(54) MULTI-MODE ENVELOPE TRACKING TARGET VOLTAGE CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 25 days.

(21) Appl. No.: 16/508,768

(22) Filed: Jul. 11, 2019

(65) Prior Publication Data

US 2020/0295713 A1 Sep. 17, 2020

Related U.S. Application Data

(60) Provisional application No. 62/817,826, filed on Mar. 13, 2019.

(51) Int. Cl.
| | |
|---|---|
| H03F 1/02 | (2006.01) |
| H03F 3/21 | (2006.01) |
| H03F 3/19 | (2006.01) |
| H03M 1/12 | (2006.01) |

(52) U.S. Cl.
CPC ............ *H03F 1/0222* (2013.01); *H03F 1/025* (2013.01); *H03F 3/19* (2013.01); *H03F 3/21* (2013.01); *H03M 1/12* (2013.01); *H03F 2200/102* (2013.01)

(58) Field of Classification Search
USPC .................................. 330/277, 136, 296–297
See application file for complete search history.

(56) References Cited

U.S. PATENT DOCUMENTS

| | | |
|---|---|---|
| 6,529,716 B1 | 3/2003 | Eidson et al. |
| 6,788,151 B2 | 9/2004 | Shvarts et al. |
| 8,019,289 B2 | 9/2011 | Gorbachov |
| 8,290,453 B2 | 10/2012 | Yoshihara |
| 8,385,859 B2 | 2/2013 | Hamano |
| 8,476,976 B2 | 7/2013 | Wimpenny |

(Continued)

OTHER PUBLICATIONS

U.S. Appl. No. 16/689,236, filed Nov. 20, 2019.

(Continued)

*Primary Examiner* — Hieu P Nguyen
(74) *Attorney, Agent, or Firm* — Withrow & Terranova, P.L.L.C.

(57) ABSTRACT

A multi-mode envelope tracking (ET) target voltage circuit is provided. In an ET amplifier apparatus, an amplifier circuit is configured to amplify a radio frequency (RF) signal based on a time-variant ET voltage, which is generated based on a time-variant ET target voltage configured to track a time-variant power envelope of the RF signal. Notably, when the ET amplifier apparatus operates in a fifth-generation (5G) standalone (SA) or non-standalone (NSA) mode, the amplifier circuit may experience interference creating a reverse intermodulation product (rIMD) that can degrade efficiency and performance of the amplifier circuit. In examples discussed herein, the multi-mode ET target voltage circuit is configured to generate the ET target voltage based on a reduced slew rate to help suppress the rIMD at the amplifier circuit, thus making it possible to improve efficiency and performance of the ET amplifier apparatus in the SA and the NSA modes.

20 Claims, 4 Drawing Sheets

(56) References Cited

U.S. PATENT DOCUMENTS

| | | |
|---|---|---|
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 * | 6/2015 | Yan .................... H04L 27/3411 |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |
| 2020/0350878 A1 | 11/2020 | Drogi et al. |

OTHER PUBLICATIONS

Notice of Allowance for U.S. Appl. No. 16/193,513, dated Mar. 25, 2020, 8 pages.

Non-Final Office Action for U.S. Appl. No. 16/250,229, dated Apr. 29, 2020, 7 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

Non-Final Office Action for U.S. Appl. No. 16/278,886, dated Apr. 29, 2020, 9 pages.

Quayle Action for U.S. Appl. No. 16/267,779, dated May 1, 2020, 8 pages.

Final Office Action for U.S. Appl. No. 16/263,368, dated May 22, 2020, 9 pages.

Notice of Allowance for U.S. Appl. No. 16/250,229, dated Sep. 22, 2020, 7 pages.

Non-Final Office Action for U.S. Appl. No. 16/263,316, dated Jul. 17, 2020, 4 pages.

(56) References Cited

OTHER PUBLICATIONS

Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Non-Final Office Action for U.S. Appl. No. 16/263,368, dated Dec. 26, 2019, 6 pages.
Notice of Allowance for U.S. Appl. No. 16/273,288, dated Dec. 13, 2019, 8 pages.
Non-Final Office Action for U.S. Appl. No. 16/263,316, dated Dec. 23, 2019, 9 pages.
U.S. Appl. No. 16/193,513, filed Nov. 16, 2018.
U.S. Appl. No. 16/250,229, filed Jan. 17, 2019.
U.S. Appl. No. 16/267,740, filed Feb. 5, 2019.
U.S. Appl. No. 16/263,316, filed Jan. 31, 2019.
U.S. Appl. No. 16/270,119, filed Feb. 7, 2019.
U.S. Appl. No. 16/273,288, filed Feb. 12, 2019.
U.S. Appl. No. 16/278,886, filed Feb. 19, 2019.
U.S. Appl. No. 16/250,298, filed Jan. 17, 2019.
U.S. Appl. No. 16/267,779, filed Feb. 5, 2019.
U.S. Appl. No. 16/263,368, filed Jan. 31, 2019.
U.S. Appl. No. 16/508,704, filed Jul. 11, 2019.
U.S. Appl. No. 16/514,339, filed Jul. 17, 2019.
Quayle Action for U.S. Appl. No. 16/267,740, mailed Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,704, dated Dec. 30, 2020, 7 pages.
Quayle Action for U.S. Appl. No. 16/514,339, mailed Nov. 19, 2020, 9 pages.

* cited by examiner

MULTI-MODE ENVELOPE TRACKING TARGET VOLTAGE CIRCUIT AND RELATED APPARATUS

RELATED APPLICATIONS

This application claims the benefit of U.S. provisional patent application Ser. No. 62/817,826, filed on Mar. 13, 2019, the disclosure of which is hereby incorporated herein by reference in its entirety.

FIELD OF THE DISCLOSURE

The technology of the disclosure relates generally to an envelope tracking (ET) power amplifier circuit/apparatus.

BACKGROUND

Fifth-generation (5G) new radio (NR) (5G-NR) has been widely regarded as the new generation of wireless communication technology beyond the current third-generation (3G) communication technology, such as wideband code division multiple access (WCDMA), and fourth-generation (4G) communication technology, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards.

Notably, a 5G-NR wireless communication system may be deployed as a non-standalone (NSA) system or a standalone (SA) system. In an NSA system, a 5G-enabled wireless communication device (e.g., a smartphone) is configured to transmit and/or receive control information and data payloads in an anchor band (e.g., a 4G frequency band) and a 5G frequency band, respectively. In contrast, in a SA system, the 5G-enabled wireless communication device will communicate both control information and data payloads exclusively in the 5G frequency band.

Further, to achieve the higher data rate in the 5G-enabled wireless communication device, sophisticated power amplifiers (PAs) may be employed to increase output power of a 5G RF signal(s) communicated by the 5G-enabled wireless communication device. However, the increased output power of 5G RF signal(s) can lead to increased power consumption and thermal dissipation, thus compromising overall performance and user experiences. Envelope tracking (ET) is a power management technology designed to improve efficiency levels of PAs to help reduce power consumption and thermal dissipation in the 5G-enabled wireless communication device. In this regard, it may be desired to ensure that the PAs in the 5G-enabled wireless communication device can operate efficiently in both the NSA system and the SA system.

SUMMARY

Embodiments of the disclosure relate to a multi-mode envelope tracking (ET) target voltage and related apparatus. In an ET amplifier apparatus, an amplifier circuit is be configured to amplify a radio frequency (RF) signal based on a time-variant ET voltage, which is generated based on a time-variant ET target voltage configured to track a time-variant power envelope of the RF signal. Notably, when the ET amplifier apparatus operates in a fifth-generation (5G) standalone (SA) or non-standalone (NSA) mode, the amplifier circuit may experience interference creating a reverse intermodulation product (rIMD) that can degrade efficiency and performance of the amplifier circuit. In examples discussed herein, the multi-mode ET target voltage circuit is configured to generate the ET target voltage based on a reduced slew rate to help suppress the rIMD at the amplifier circuit, thus making it possible to improve efficiency and performance of the ET amplifier apparatus in the SA and the NSA modes.

In one aspect, a multi-mode ET target voltage circuit is provided. The multi-mode ET target voltage circuit includes a lower-slope look-up table (LUT) configured to correlate a number of power amplitudes with a number of first target voltage amplitudes based on a lower slew rate. The multi-mode ET target voltage circuit also includes a higher-slope LUT configured to correlate the power amplitudes with a number of second target voltage amplitudes based on a higher slew rate greater than the lower slew rate. The multi-mode ET target voltage circuit also includes a target voltage control circuit. The target voltage control circuit is configured to receive the power amplitudes. The target voltage control circuit is also configured to determine whether the multi-mode ET target voltage circuit is configured to operate in a SA mode or an NSA mode. The target voltage control circuit is also configured to convert the power amplitudes into the first target voltage amplitudes based on the lower-slope LUT in response to the multi-mode ET target voltage circuit being configured to operate in the SA mode or the NSA mode.

In another aspect, an ET amplifier apparatus is provided. The ET amplifier apparatus includes an amplifier circuit configured to amplify an RF signal based on an ET voltage. The ET amplifier apparatus also includes an ET integrated circuit (ETIC) configured to generate the ET voltage based on an ET target voltage. The ET amplifier apparatus also includes a multi-mode ET target voltage circuit. The multi-mode ET target voltage circuit is configured to determine whether the multi-mode ET target voltage circuit is configured to operate in a SA mode or an NSA mode. The multi-mode ET target voltage circuit is also configured to generate the ET target voltage corresponding to a lower slew rate in response to the multi-mode ET target voltage circuit being configured to operate in the SA mode or the NSA mode. The multi-mode ET target voltage circuit is also configured to generate the ET target voltage corresponding to a higher slew rate greater than the lower slew rate in response to the multi-mode ET target voltage circuit not being configured to operate in the SA mode or the NSA mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode envelope tracking (ET) target voltage and related apparatus. In an ET amplifier apparatus, an amplifier circuit is configured to amplify a radio frequency (RF) signal based on a time-variant ET voltage, which is generated based on a time-variant ET target voltage configured to track a time-variant power envelope of the RF signal. Notably, when the ET amplifier apparatus operates in a fifth-generation (5G) standalone (SA) or non-standalone (NSA) mode, the amplifier circuit may experience interference creating a reverse intermodulation product (rIMD) that can degrade efficiency and performance of the amplifier circuit. In examples discussed herein, the multi-mode ET target voltage circuit is configured to generate the ET target voltage based on a reduced slew rate to help suppress the rIMD at the amplifier circuit, thus making it possible to improve efficiency and performance of the ET amplifier apparatus in the SA and the NSA modes.

Figure 1:
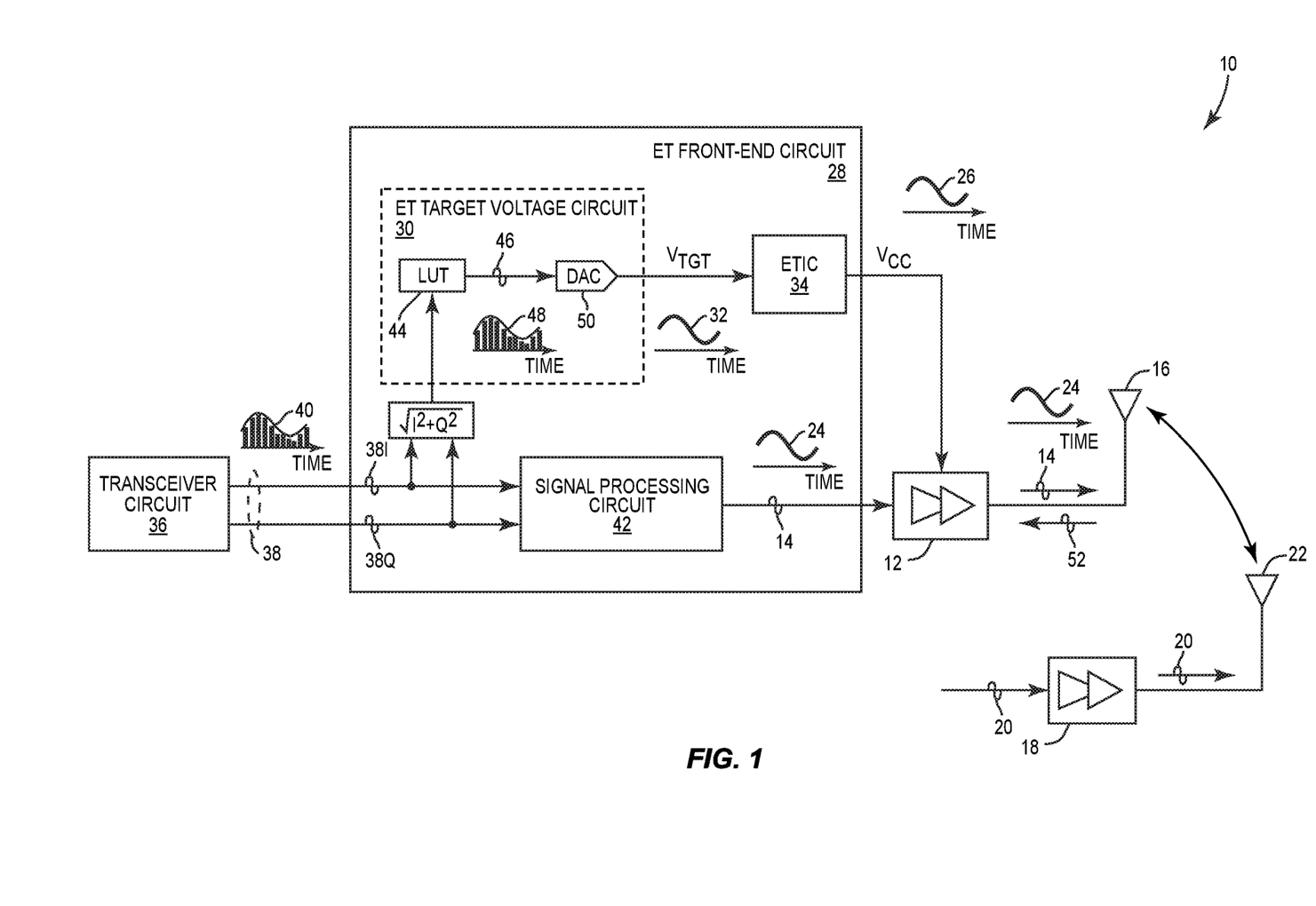
FIG. 1 is a schematic diagram of an exemplary existing envelope tracking (ET) amplifier apparatus than may suffer degraded performance when operating in a fifth-generation (5G) standalone (SA) mode or a 5G non-standalone (NSA) mode.

Before discussing the multi-mode ET target voltage circuit and the related apparatus of the present disclosure, a brief overview of an existing ET amplifier apparatus is first provided with reference to FIG. 1 to help demonstrate how an amplifier circuit in the existing ET amplifier apparatus can suffer degraded efficiency and performance in the SA and NSA modes due to reverse interference. The discussion of specific exemplary aspects of a multi-mode ET target voltage circuit and related apparatus according to the present disclosure starts below with reference to FIG. 2.

In this regard, FIG. 1 is a schematic diagram of an exemplary existing ET amplifier apparatus 10 than may suffer degraded performance when operating in a 5G SA mode or a 5G NSA mode. In the NSA mode, a 5G-enabled wireless communication device, which can employ the existing ET amplifier apparatus 10, may be configured to communicate concurrently control information in an anchor band (e.g., a 4G frequency band) and data payloads in a 5G frequency band (e.g., 5G frequency band n41, n77, n79, etc.). In contrast, in the SA mode, the 5G-enabled wireless communication device may be configured to communicate concurrently the control information and the data payloads in the 5G frequency band. Given that both the SA mode and the NSA mode are viable operation modes permitted by the third-generation partnership project (3GPP) standard, the 5G-enabled wireless communication device may need to operate in both the SA mode and the NSA mode. The 5G-enabled wireless communication device may also need to operate outside the 5G SA mode and the NSA mode to be backward compatible with legacy communication systems.

The existing ET amplifier apparatus 10 includes a first amplifier circuit 12 configured to amplify an RF signal 14 (e.g., a 5G signal or a 4G anchor signal) for transmission via a first antenna 16. The existing ET amplifier apparatus 10 can also include a second amplifier circuit 18 configured to amplify a second RF signal 20 (e.g., a 5G signal or a 4G signal) for transmission via a second antenna 22. For example, in the SA mode, both the RF signal 14 and the second RF signal 20 can be the same 5G signal. In contrast, in the NSA mode, one of the RF signal 14 and the second RF signal 20 can be the 4G anchor signal while the other one of the RF signal 14 and the second RF signal 20 is a 5G signal. In this regard, the first antenna 16 and the second antenna 22 will be radiating the RF signal 14 and the second RF signal 20 concurrently in both the SA mode and the NSA mode.

The RF signal 14 may correspond to a time-variant power envelope 24. The first amplifier circuit 12 is configured to amplify the RF signal 14 based on an ET voltage $V_{CC}$ that corresponds to a time-variant voltage envelope 26. For the first amplifier circuit 12 to operate with optimal linearity and efficiency, the time-variant voltage envelope 26 may need to track (e.g., rises and falls) closely with the time-variant power envelope 24.

The existing ET amplifier apparatus 10 includes an ET front-end circuit 28 configured to generate the ET voltage $V_{CC}$ corresponding to the time-variant voltage envelope 26. The ET front-end circuit 28 may include an ET target voltage circuit 30 configured to generate an ET target voltage $V_{TGT}$ corresponding to a time-variant target voltage envelope 32. The ET front-end circuit 28 may also include an ET integrated circuit (ETIC) 34 configured to generate the ET voltage $V_{CC}$ based on the ET target voltage $V_{TGT}$. In this regard, the time-variant voltage envelope 26 of the ET voltage $V_{CC}$ may be configured to track the time-variant target voltage envelope 32 of the ET target voltage $V_{TGT}$.

The ET front-end circuit 28 may be coupled to a transceiver circuit 36 configured to generate a digital signal 38 corresponding to a number of power amplitudes 40. The ET front-end circuit 28 may include a signal processing circuit 42 configured to generate the RF signal 14 based on the digital signal 38. As such, the time-variant power envelope 24 of the RF signal 14 can be configured to track the power amplitudes 40 of the digital signal 38.

In a non-limiting example, the digital signal 38 can be so generated to include an in-phase signal 38I corresponding to an in-phase amplitude I and a quadrature signal 38Q corresponding to a quadrature amplitude Q. Accordingly, the power amplitudes 40 of the digital signal 38 can be determined as $\sqrt{I^2+Q^2}$.

The ET target voltage circuit 30 may include a look-up table (LUT) 44. The LUT 44 may be configured to generate a digital target voltage signal 46 based on the power amplitudes 40. The digital target voltage signal 46 may correspond to a number of target voltage amplitudes 48 that are correlated with the power amplitudes 40 by the LUT 44. In a non-limiting example, the LUT 44 can be configured to correlate the target voltage amplitudes 48 with the power amplitudes 40 based on a linear IsoGain relationship, in which the target voltage amplitudes 48 increase or decrease proportionally relative to the power amplitudes 40. The ET target voltage circuit 30 may include a voltage digital-to-analog converter (DAC) 50. The voltage DAC 50 may be configured to convert the digital target voltage signal 46 into the ET target voltage $V_{TGT}$. In this regard, the time-variant target voltage envelope 32 is configured to track the target voltage amplitudes 48. As such, the ETIC 34 may generate the ET voltage $V_{CC}$ having the time-variant voltage envelope 26 that tracks the time-variant target voltage envelope 32 of the ET target voltage $V_{TGT}$ and, accordingly, the time-variant power envelope 24 of the RF signal 14.

The first antenna 16 and the second antenna 22 may be physically separated in the 5G-enabled wireless communication device to provide approximately 10 to 20 dB of RF separation. For example, the first antenna 16 can be provided near one edge (e.g., top edge) of the 5G-enabled wireless communication device, while the second antenna 22 can be provided near an opposing edge (e.g., bottom edge) of the 5G-enabled wireless communication device to provide such physical separation. However, given that the RF signal 14 and the second RF signal 20 may need to be radiated from the first antenna 16 and the second antenna 22 concurrently with relatively higher power, the 10 to 20 dB RF separation may become insufficient. As a result, a portion of the second RF signal 20 can be coupled to the first antenna 16 to generate a reverse interference signal 52. The reverse interference signal 52 may arrive at the first antenna 16 in random phases. As such, the reverse interference signal 52 may interfere with the RF signal 14 either constructively or destructively at the first amplifier circuit 12, thus causing the RF signal 14 to deviate from the time-variant power envelope 24.

In particular, when the reverse interference signal 52 constructively interferes with the RF signal 14, it may cause the RF signal 14 to exceed the time-variant power envelope 24. However, the ETIC 34 is still generating the ET voltage $V_{CC}$ having the time-variant voltage envelope 26 to track the time-variant power envelope 24. As such, the ET voltage $V_{CC}$ may become insufficient to keep the first amplifier circuit 12 in linear operation. Instead, the first amplifier circuit 12 may be forced to operate in a compression mode, thus causing the time-variant power envelope 24 to be clipped between the first amplifier circuit 12 and the first antenna 16. Consequently, the reverse interference signal 52 may interfere with the RF signal 14 to create a reverse intermodulation product (rIMD) at the first amplifier circuit 12, thus compromising key performance indicators, such as error vector magnitude (EVM), during the SA mode and the NSA mode operations. Hence, it may be desired to enhance the existing ET amplifier apparatus 10 to effectively suppress the rIMD during the SA mode and the NSA mode operations.

Figure 2:
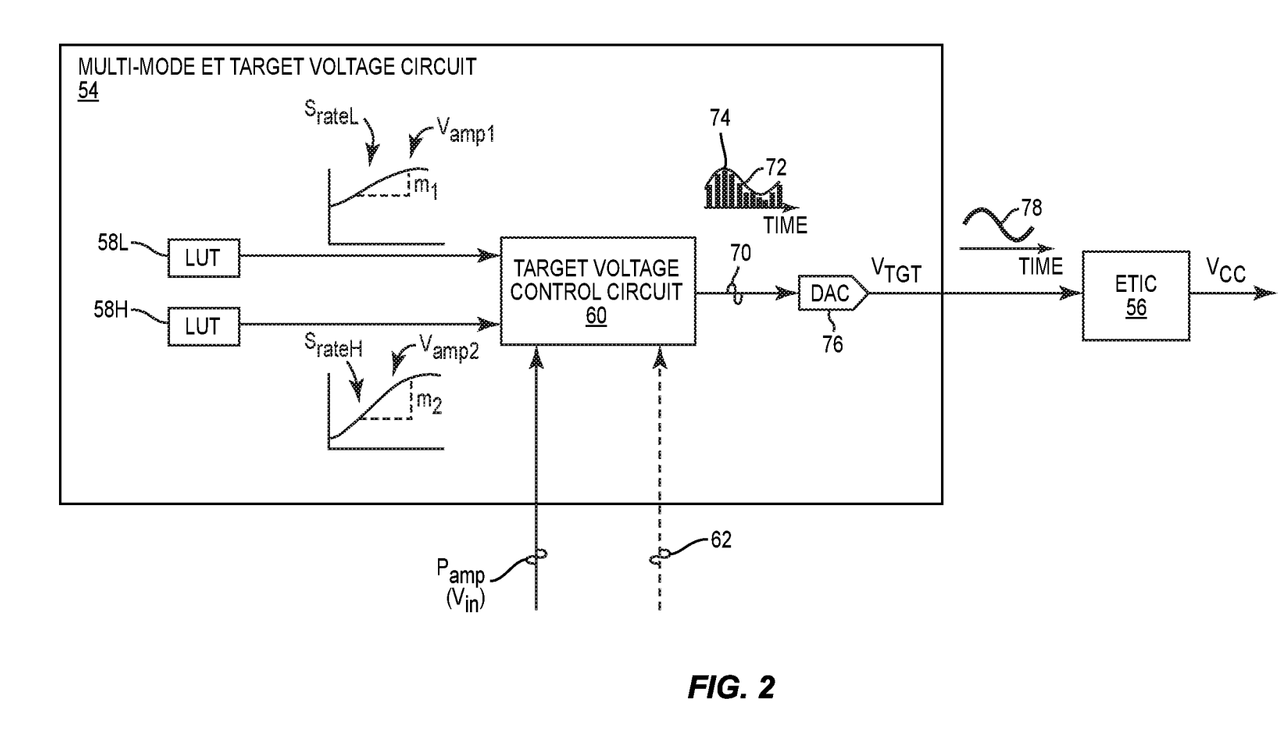
FIG. 2 is a schematic diagram of an exemplary multi-mode ET target voltage circuit configured according to an embodiment of the present disclosure to operate in multiple modes based on multiple look-up tables (LUTs) corresponding to multiple slew rates.

In this regard, FIG. 2 is a schematic diagram of an exemplary multi-mode ET target voltage circuit 54 configured according to an embodiment of the present disclosure to operate in multiple modes based on multiple LUTs corresponding to multiple slew rates. In a non-limiting example, a gain error $G_{error}$ (e.g., EVM) of an amplifier circuit, such as the first amplifier circuit 12 and the second amplifier circuit 18 in FIG. 1, can be approximated based on equation (Eq. 1) below.

$$G_{error} \approx (\partial \text{Gain} * \text{Slew Rate} * t_{error})/\partial V_{CC} \qquad (\text{Eq. 1})$$

In the equation (Eq. 1) above, ∂Gain represents an IsoGain of the amplifier circuit, Slew Rate represents a slew rate of the amplifier circuit, $t_{error}$ represents an operating duration of the amplifier circuit, and $V_{CC}$ represents the ET voltage $V_{CC}$ received by the amplifier circuit. In this regard, the gain error $G_{error}$ of the amplifier circuit is proportionally related to the slew rate $S_{rate}$ and inversely related to the ET voltage $V_{CC}$. Accordingly, it may be possible to reduce the gain error $G_{error}$ of the amplifier circuit by reducing the slew rate and/or increasing the ET voltage $V_{CC}$.

In this regard, the multi-mode ET target voltage circuit 54 can be configured to generate an ET target voltage $V_{TGT}$ based on a lower-slope LUT that corresponds to a lower slew rate when operating in the SA mode or the NSA mode. As discussed in detail below, by generating the ET target voltage $V_{TGT}$ based on the lower slew rate, the multi-mode ET target voltage circuit 54 may generate the ET target voltage $V_{TGT}$ at a higher level than the ET target voltage $V_{TGT}$ being generated by the existing ET amplifier apparatus 10 of FIG. 1. Accordingly, an ETIC 56 may generate an ET voltage $V_{CC}$ at a higher level based on the ET target voltage $V_{TGT}$ generated by the multi-mode ET target voltage circuit 54. As a result, it may be possible to reduce the gain error $G_{error}$ of the amplifier circuit in accordance to equation (Eq. 1) above.

The multi-mode ET target voltage circuit 54 may be configured to include a lower-slope LUT 58L and a higher-slope LUT 58H corresponding to a lower-slope $m_1$ and a higher slope $m_2$ ($m_2 > m_1$), respectively. The lower-slope LUT 58L may be configured to correlate a number of power amplitudes $P_{amp}$ with a number of first target voltage amplitudes $V_{amp1}$ based on a lower slew rate $S_{rateL}$. The higher-slope LUT 58H may be configured to correlate the power amplitudes $P_{amp}$ with a number of second target voltage amplitudes $V_{amp2}$ based on a higher slew rate $S_{rateH}$ that is greater than the lower slew rate $S_{rateL}$ ($S_{rateH} > S_{rateL}$). Hereinafter, the lower slew rate $S_{rateL}$ refers to a respective rate of change based on the lower slope $m_1$ and the higher slew rate $S_{rateH}$ refers to a respective rate of change based on the higher slope $m_2$. In a non-limiting example, the higher-slope LUT 58H can be configured to establish an IsoGain correlation between the power amplitudes $P_{amp}$ and the second target voltage amplitudes $V_{amp2}$. In contrast, the lower-slope LUT 58L is configured to establish a non-IsoGain correlation between the power amplitudes $P_{amp}$ and the first target voltage amplitudes $V_{amp1}$.

In one embodiment, the lower-slope LUT 58L and the higher-slope LUT 58H can be implemented in a consolidated LUT as shown below.

| Consolidated LUT | | |
|---|---|---|
| $P_{amp}$ | $V_{amp1}$ | $V_{amp2}$ |

In Table 1, the $P_{amp}$ column and the $V_{amp1}$ column may be considered as being equivalent to the lower-slope LUT 58L, and the $P_{amp}$ column and the $V_{amp2}$ column may be considered as being equivalent to the higher-slope LUT 58H. Alternatively, it may also be possible to implement the lower-slope LUT 58L and the higher-slope LUT 58H as two separate LUTs as shown below.

| Lower-Slope LUT | |
|---|---|
| $P_{amp}$ | $V_{amp1}$ |

| Higher-Slope LUT | |
|---|---|
| $P_{amp}$ | $V_{amp2}$ |

Notably, the power amplitudes $P_{amp}$ can be proportionally related to a number of respective input voltage amplitudes $V_{in}$. In this regard, the lower-slope LUT 58L and the higher-slope LUT 58H can also be so configured to correlate the input voltage amplitudes $V_{in}$ with the first target voltage amplitudes $V_{amp1}$ and the second target voltage amplitudes $V_{amp2}$, as shown below.

| Consolidated LUT | | |
|---|---|---|
| $V_{in}$ | $V_{amp1}$ | $V_{amp2}$ |

The multi-mode ET target voltage circuit 54 can include a target voltage control circuit 60 configured to receive the power amplitudes $P_{amp}$. Accordingly, the target voltage control circuit 60 can be configured to determine whether the multi-mode ET target voltage circuit is configured to operate in the SA mode or the NSA mode. In a non-limiting example, the target voltage control circuit 60 can be configured to determine whether the multi-mode ET target voltage circuit is configured to operate in the SA mode or the NSA mode based on an indication signal 62. The indication signal 62 may be generated inside or outside the multi-mode ET target voltage circuit 54. In response to determining that the multi-mode ET target voltage circuit 54 is configured to operate in the SA mode or the NSA mode, the target voltage control circuit 60 converts the power amplitudes $P_{amp}$ into the first target voltage amplitudes $V_{amp1}$ based on the lower-slope LUT 58L. Otherwise, the target voltage control circuit 60 converts the power amplitudes $P_{amp}$ into the second target voltage amplitudes $V_{amp2}$ based on the higher-slope LUT 58H.

Figure 3A:
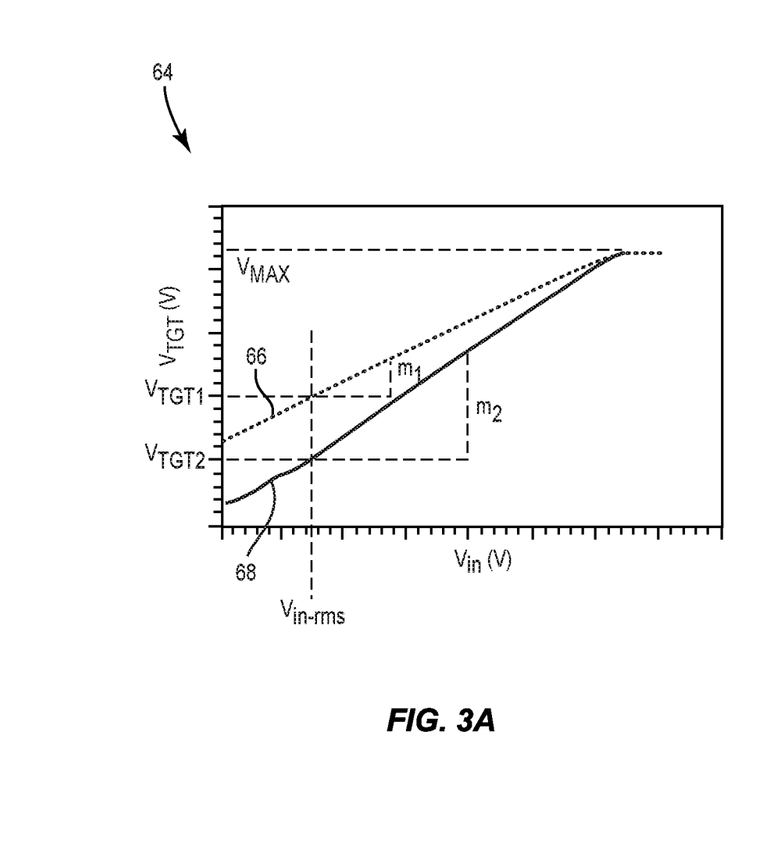
FIG. 3A is a graphic diagram providing an exemplary illustration of how the multiple LUTs can affect an ET target voltage generated by the multi-mode ET target voltage circuit of FIG. 2.

FIG. 3A is a graphic diagram 64 providing an exemplary illustration of how the lower-slope LUT 58L and the higher-slope LUT 58H can affect the ET target voltage $V_{TGT}$ generated by the multi-mode ET target voltage circuit of FIG. 2. Common elements between FIGS. 2 and 3A are shown therein with common element numbers and will not be re-described herein.

The graphic diagram 64 includes a first gain curve 66 and a second gain curve 68 corresponding to the lower-slope LUT 58L and the higher-slope LUT 58H, respectively. Accordingly, the first gain curve 66 corresponds to the lower slope $m_1$ and thus the lower slew rate $S_{rateL}$. Similarly, the second gain curve 68 corresponds to the higher slope $m_2$ and thus the higher slew rate $S_{rateH}$. Notably, the first gain curve 66 and the second gain curve 68 converge at a maximum voltage $V_{MAX}$.

As shown in FIG. 3A, for a given root-mean-square (RMS) average of the input voltage amplitude $V_{in-rms}$, the first gain curve 66 corresponds to a higher ET target voltage $V_{TGT1}$ and the second gain curve 68 corresponds to a lower ET target voltage $V_{TGT2}$ ($V_{TGT1} > V_{TGT2}$). In this regard, the multi-mode ET target voltage circuit 54 will be able to increase the ET target voltage $V_{TGT}$ by converting the power amplitudes $P_{amp}$ into the first target voltage amplitudes $V_{amp1}$ based on the lower-slope LUT 58L. In contrast, the multi-mode ET target voltage circuit 54 will be able to decrease the ET target voltage $V_{TGT}$ by converting the power amplitudes $P_{amp}$ into the second target voltage amplitudes $V_{amp2}$ based on the higher-slope LUT 58H.

With reference back to FIG. 2, the target voltage control circuit 60 can be configured to generate a digital target voltage signal 70. When the multi-mode ET target voltage circuit 54 is configured to operate in the SA mode or the NSA mode, the target voltage control circuit 60 generates the digital target voltage signal 70 having a first time-variant amplitude envelope 72 that corresponds to the first target voltage amplitudes $V_{amp1}$. Otherwise, the target voltage control circuit 60 generates the digital target voltage signal 70 having a second time-variant amplitude envelope 74 that corresponds to the second target voltage amplitudes $V_{amp2}$.

The multi-mode ET target voltage circuit 54 can be configured to include a voltage DAC 76. When the multi-mode ET target voltage circuit 54 operates in the SA mode or the NSA mode, the voltage DAC 76 converts the digital target voltage signal 70 having the first time-variant amplitude envelope 72 into the ET target voltage $V_{TGT}$ having a time-variant target voltage envelope 78 configured to track (e.g., rise and fall) the first time-variant amplitude envelope 72. Otherwise, the voltage DAC 76 converts the digital target voltage signal 70 having the second time-variant amplitude envelope 74 into the ET target voltage $V_{TGT}$ having the time-variant target voltage envelope 78 configured to track (e.g., rise and fall) the second time-variant amplitude envelope 74.

The ETIC 56 may generate the ET voltage $V_{CC}$ based on the ET target voltage $V_{TGT}$. In this regard, when the multi-mode ET target voltage circuit 54 operates in the SA mode or the NSA mode, the ET voltage $V_{CC}$ will track the first target voltage amplitudes $V_{amp1}$. In contrast, when the multi-mode ET target voltage circuit 54 does not operate in the SA mode or the NSA mode, the ET voltage $V_{CC}$ will track the second target voltage amplitudes $V_{amp2}$.

According to the previous discussion of FIG. 3A, the ET target voltage $V_{TGT}$ will be higher when the ET target voltage $V_{TGT}$ is generated based on the lower-slope LUT 58L. As a result, the ETIC 56 will generate the ET voltage $V_{CC}$ at a higher level based on the ET target voltage $V_{TGT}$ that tracks the first target voltage amplitudes $V_{amp1}$.

Figure 3B:
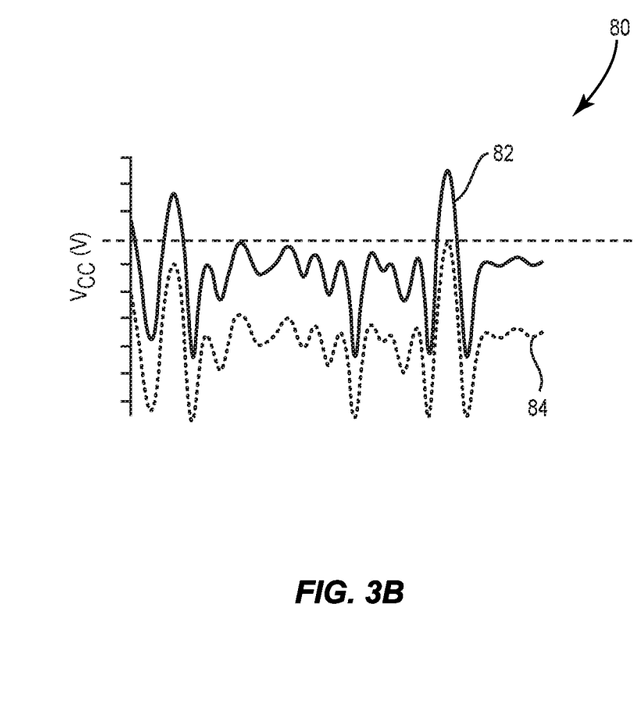
FIG. 3B is a graphic diagram 80 providing an exemplary illustration of how an ET voltage can be affected by the ET target voltage in FIG. 3A.

FIG. 3B is a graphic diagram 80 providing an exemplary illustration on how the ET voltage $V_{CC}$ can be affected by a variation of the ET target voltage $V_{TGT}$ generated based on the lower-slope LUT 58L and the higher-slope LUT 58H. Elements in FIG. 2 are referenced in conjunction with FIG. 3B and will not be re-described herein.

The graphic diagram 80 includes a first ET voltage curve 82 and a second ET voltage curve 84. The first ET voltage curve 82 corresponds to the ET target voltage $V_{TGT}$ generated based on the lower-slope LUT 58L and the second ET voltage curve 84 corresponds to the ET target voltage $V_{TGT}$ generated based on the higher-slope LUT 58H. Given that the ET target voltage $V_{TGT}$ generated based on the lower-slope LUT 58L is higher than the ET target voltage $V_{TGT}$ generated based on the higher-slope LUT 58H, the ET voltage $V_{CC}$ will also become higher when the ET voltage $V_{CC}$ tracks the first time-variant amplitude envelope 72. As such, the multi-mode ET target voltage circuit 54 may help prevent the amplitude clipping problem as happened to the time-variant power envelope 24 in the existing ET amplifier apparatus 10 of FIG. 1.

Figure 4:
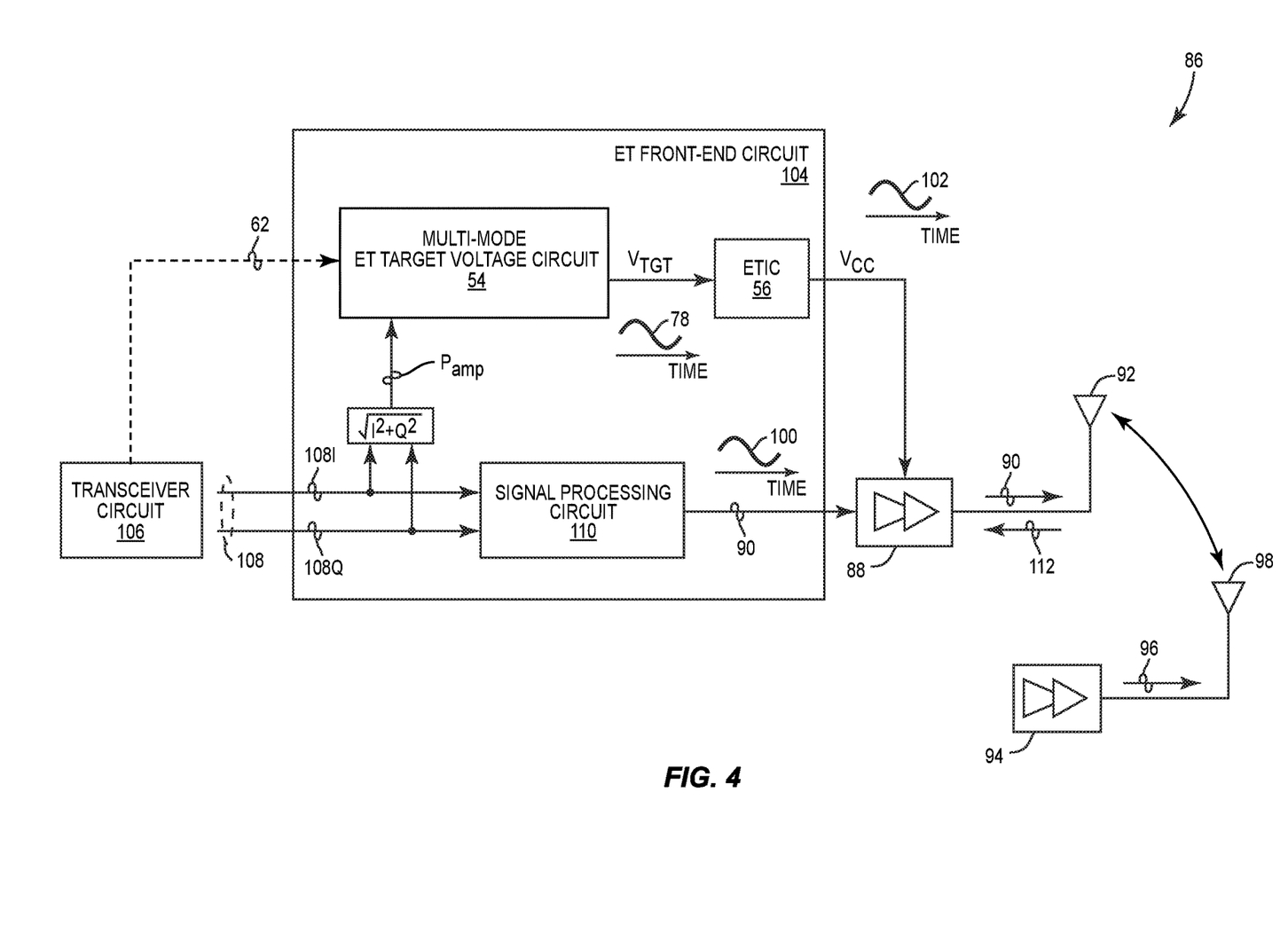
FIG. 4 is a schematic diagram of an exemplary ET amplifier apparatus incorporating the multi-mode ET target voltage circuit of FIG. 2.

FIG. 4 is a schematic diagram of an exemplary ET amplifier apparatus 86 incorporating the multi-mode ET target voltage circuit 54 of FIG. 2. Common elements between FIGS. 2 and 4 are shown therein with common element numbers and will not be re-described herein.

The ET amplifier apparatus 86 includes an amplifier circuit 88 configured to amplify an RF signal 90 (e.g., a 5G signal or a 4G anchor signal) for transmission via an antenna 92. The ET amplifier apparatus 86 can also include a second amplifier circuit 94 configured to amplify a second RF signal 96 (e.g., a 5G signal or a 4G signal) for transmission via a second antenna 98. For example, in the SA mode, both the RF signal 90 and the second RF signal 96 can be the same 5G signal. In contrast, in the NSA mode, one RF signal among the RF signal 90 and the second RF signal 96 can be the 4G anchor signal while another RF signal among the RF signal 90 and the second RF signal 96 is a 5G signal. In this regard, the antenna 92 and the second antenna 98 will be radiating the RF signal 90 and the second RF signal 96 concurrently in both the SA mode and the NSA mode.

The RF signal 90 may correspond to a time-variant power envelope 100. The amplifier circuit 88 is configured to amplify the RF signal 90 based on the ET voltage $V_{CC}$ that corresponds to a time-variant voltage envelope 102. For the amplifier circuit 88 to operate with optimal linearity and efficiency, the time-variant voltage envelope 102 of the ET voltage $V_{CC}$ may need to track (e.g., rises and falls) closely the time-variant power envelope 100 of the RF signal 90.

The ET amplifier apparatus 86 includes an ET front-end circuit 104 configured to generate the ET voltage $V_{CC}$ corresponding to the time-variant voltage envelope 102. The ET front-end circuit 104 includes the multi-mode ET target voltage circuit 54 configured to generate the ET target voltage $V_{TGT}$ as described earlier in FIG. 2. The ET front-end circuit 104 may also include the ETIC 56 configured to generate the ET voltage $V_{CC}$ based on the ET target voltage $V_{TGT}$. In this regard, according to discussions in FIGS. 2, 3A, and 3B, the time-variant voltage envelope 102 of the ET voltage $V_{CC}$ will track the first target voltage amplitudes $V_{amp1}$ in the SA mode and the NSA mode and track the second target voltage amplitudes $V_{amp2}$ outside the SA mode and the NSA mode. Accordingly, the ET voltage $V_{CC}$ will be higher in the SA mode and the NSA mode relative to the ET voltage $V_{CC}$ outside the SA mode and the NSA mode.

The ET front-end circuit 104 may be coupled to a transceiver circuit 106 configured to generate a digital signal 108 corresponding to the power amplitudes $P_{amp}$. The ET front-end circuit 104 may include a signal processing circuit 110 configured to generate the RF signal 90 based on the digital signal 108. As such, the time-variant power envelope 100 of the RF signal 90 can be configured to track the power amplitudes $P_{amp}$ associated with the digital signal 108.

In a non-limiting example, the digital signal 108 can be so generated to include an in-phase signal 108I corresponding to an in-phase amplitude I and a quadrature signal 108Q corresponding to a quadrature amplitude Q.

Accordingly, the power amplitudes $P_{amp}$ of the digital signal 108 can be determined as $P_{amp} = \sqrt{I^2+Q^2}$.

The antenna 92 and the second antenna 98 may be physically separated in a 5G-enabled wireless communication device to provide approximately 10 to 20 dB of RF separation. For example, the antenna 92 can be provided near one edge (e.g., top edge) of the 5G-enabled wireless communication device, while the second antenna 98 can be provided near an opposing edge (e.g., bottom edge) of the 5G-enabled wireless communication device to provide such physical separation. However, given that the RF signal 90 and the second RF signal 96 may need to be radiated from the antenna 92 and the second antenna 98 concurrently with relatively higher power, the 10 to 20 dB RF separation may become insufficient. As a result, a portion of the second RF signal 96 can be coupled to the antenna 92 to generate a reverse interference signal 112. The reverse interference signal 112 may arrive at the antenna 92 in random phases. As such, the reverse interference signal 112 may interfere with the RF signal 90 either constructively or destructively at the amplifier circuit 88, thus causing the RF signal 90 to deviate from the time-variant power envelope 100.

In particular, when the reverse interference signal 112 constructively interferes with the RF signal 90, it may cause the RF signal 90 to exceed the time-variant power envelope 100. However, as discussed above, the multi-mode ET target voltage circuit 54 can generate the ET target voltage $V_{TGT}$ at a higher level based on the lower-slope LUT 58L. Accordingly, the ETIC 56 will generate the ET voltage $V_{CC}$ at a higher level as well. As such, the ET voltage $V_{CC}$ may have sufficient headroom over a time-variant voltage surge caused by the reverse interference signal 112. As such, the ET amplifier apparatus 86 may be able to sufficiently suppress the rIMD that may result from the reverse interference signal 112. Accordingly, it may be possible to reduce the gain error $G_{error}$ of the amplifier circuit 88, thus helping to improve such performance indicators as EVM in the ET amplifier apparatus 86.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode envelope tracking (ET) target voltage circuit comprising:
   a lower-slope look-up table (LUT) configured to correlate a plurality of power amplitudes with a plurality of first target voltage amplitudes based on a lower slew rate;
   a higher-slope LUT configured to correlate the plurality of power amplitudes with a plurality of second target voltage amplitudes based on a higher slew rate greater than the lower slew rate; and
   a target voltage control circuit configured to:
      receive the plurality of power amplitudes;
      determine whether the multi-mode ET target voltage circuit is configured to operate in a standalone (SA) mode or a non-standalone (NSA) mode; and
      convert the plurality of power amplitudes into the plurality of first target voltage amplitudes based on the lower-slope LUT in response to the multi-mode ET target voltage circuit being configured to operate in the SA mode or the NSA mode.

2. The multi-mode ET target voltage circuit of claim 1 wherein the target voltage control circuit is further configured to convert the plurality of power amplitudes into the plurality of second target voltage amplitudes based on the higher-slope LUT in response to the multi-mode ET target voltage circuit not being configured to operate in the SA mode or the NSA mode.

3. The multi-mode ET target voltage circuit of claim 2 wherein the target voltage control circuit is further configured to:
   generate a digital target voltage signal having a first time-variant amplitude envelope corresponding to the plurality of first target voltage amplitudes when the multi-mode ET target voltage circuit is configured to operate in the SA mode or the NSA mode; and
   generate the digital target voltage signal having a second time-variant amplitude envelope corresponding to the plurality of second target voltage amplitudes when the multi-mode ET target voltage circuit is not configured to operate in the SA mode or the NSA mode.

4. The multi-mode ET target voltage circuit of claim 3 further comprising a digital-to-analog converter (DAC) configured to:
   convert the digital target voltage signal into an ET target voltage having a time-variant target voltage envelope tracking the first time-variant amplitude envelope when the multi-mode ET target voltage circuit is configured to operate in the SA mode or the NSA mode; and
   convert the digital target voltage signal into the ET target voltage having the time-variant target voltage envelope tracking the second time-variant amplitude envelope when the multi-mode ET target voltage circuit is not configured to operate in the SA mode or the NSA mode.

5. The multi-mode ET target voltage circuit of claim 4 wherein the voltage DAC is coupled to an ET integrated circuit (ETIC) configured to generate an ET voltage based on the ET target voltage.

6. The multi-mode ET target voltage circuit of claim 5 wherein the ETIC is coupled to an amplifier circuit configured to amplify a radio frequency (RF) signal based on the ET voltage.

7. The multi-mode ET target voltage circuit of claim 1 wherein the target voltage control circuit is further configured to receive an indication signal configured to indicate whether the multi-mode ET target voltage circuit is configured to operate in the SA mode or the NSA mode.

8. The multi-mode ET target voltage circuit of claim 7 wherein the target voltage control circuit is coupled to a transceiver circuit configured to:
   generate the indication signal indicative of whether the multi-mode ET target voltage circuit is configured to operate in the SA mode or the NSA mode; and
   generate a digital signal corresponding to the plurality of power amplitudes.

9. An envelope tracking (ET) amplifier apparatus comprising:
   an amplifier circuit configured to amplify a radio frequency (RF) signal based on an ET voltage;
   an ET integrated circuit (ETIC) configured to generate the ET voltage based on an ET target voltage; and
   a multi-mode ET target voltage circuit configured to:
      determine whether the multi-mode ET target voltage circuit is configured to operate in a standalone (SA) mode or a non-standalone (NSA) mode;
      generate the ET target voltage corresponding to a lower slew rate in response to the multi-mode ET target voltage circuit being configured to operate in the SA mode or the NSA mode; and
      generate the ET target voltage corresponding to a higher slew rate greater than the lower slew rate in response to the multi-mode ET target voltage circuit not being configured to operate in the SA mode or the NSA mode.

10. The ET amplifier apparatus of claim 9 wherein the multi-mode ET target voltage circuit comprises:
    a lower-slope look-up table (LUT) configured to correlate a plurality of power amplitudes with a plurality of first target voltage amplitudes based on the lower slew rate;
    a higher-slope LUT configured to correlate the plurality of power amplitudes with a plurality of second target voltage amplitudes based on the higher slew rate; and
    a target voltage control circuit configured to:
       receive the plurality of power amplitudes; and
       convert the plurality of power amplitudes into the plurality of first target voltage amplitudes based on the lower-slope LUT in response to the multi-mode ET target voltage circuit being configured to operate in the SA mode or the NSA mode.

11. The ET amplifier apparatus of claim 10 wherein the target voltage control circuit is further configured to convert the plurality of power amplitudes into the plurality of second target voltage amplitudes based on the higher-slope LUT in response to the multi-mode ET target voltage circuit not being configured to operate in the SA mode or the NSA mode.

12. The ET amplifier apparatus of claim 11 wherein the target voltage control circuit is further configured to:
generate a digital target voltage signal having a first time-variant amplitude envelope corresponding to the plurality of first target voltage amplitudes when the multi-mode ET target voltage circuit is configured to operate in the SA mode or the NSA mode; and
generate the digital target voltage signal having a second time-variant amplitude envelope corresponding to the plurality of second target voltage amplitudes when the multi-mode ET target voltage circuit is not configured to operate in the SA mode or the NSA mode.

13. The ET amplifier apparatus of claim 12 wherein the multi-mode ET target voltage circuit further comprises a digital-to-analog converter (DAC) configured to:
convert the digital target voltage signal into the ET target voltage having a time-variant target voltage envelope tracking the first time-variant amplitude envelope when the multi-mode ET target voltage circuit is configured to operate in the SA mode or the NSA mode; and
convert the digital target voltage signal into the ET target voltage having the time-variant target voltage envelope tracking the second time-variant amplitude envelope when the multi-mode ET target voltage circuit is not configured to operate in the SA mode or the NSA mode.

14. The ET amplifier apparatus of claim 10 wherein the target voltage control circuit is further configured to receive an indication signal configured to indicate whether the multi-mode ET target voltage circuit is configured to operate in the SA mode or the NSA mode.

15. The ET amplifier apparatus of claim 14 further comprising a transceiver circuit configured to:
generate and provide the indication signal to the target voltage control circuit; and
generate a digital signal corresponding to the plurality of power amplitudes.

16. The ET amplifier apparatus of claim 15 further comprising a signal processing circuit configured to:
receive the digital signal corresponding to the plurality of power amplitudes from the transceiver circuit;
generate the RF signal having a time-variant power envelope tracking the plurality of power amplitudes; and
provide the RF signal to the amplifier circuit.

17. The ET amplifier apparatus of claim 9 wherein the amplifier circuit is configured to amplify the RF signal for transmission in a fifth-generation (5G) band in the SA mode and the NSA mode.

18. The ET amplifier apparatus of claim 9 wherein the amplifier circuit is configured to amplify the RF signal for transmission in a fifth-generation (5G) band or a fourth-generation (4G) anchor band in the NSA mode.

19. The ET amplifier apparatus of claim 9 wherein:
the RF signal is interfered by a reverse interference signal in the SA mode and the NSA mode to cause a reverse intermodulation product (rIMD) at the amplifier circuit; and
the multi-mode ET target voltage circuit is further configured generate the ET target voltage corresponding to the lower slew rate to cause the rIMD to be suppressed at the amplifier circuit.

20. The ET amplifier apparatus of claim 19 wherein:
the reverse interference signal is constructively combined with the RF signal at the amplifier circuit to cause a time-variant voltage surge; and
the ETIC is further configured to generate the ET voltage based on the ET target voltage such that the ET voltage is consistently higher than or equal to the time-variant voltage surge to suppress the rIMD at the amplifier circuit.

* * * * *

UNITED STATES PATENT AND TRADEMARK OFFICE
CERTIFICATE OF CORRECTION

PATENT NO. : 10,938,350 B2
APPLICATION NO. : 16/508768
DATED : March 2, 2021
INVENTOR(S) : Nadim Khlat Page 1 of 1

It is certified that error appears in the above-identified patent and that said Letters Patent is hereby corrected as shown below:

In the Specification

Column 5, Line 47, replace "in-phase signal 381" with --in-phase signal 38I--.
Column 6, Line 63, replace "$V_{cc}$" with --$\partial V_{cc}$--.
Column 10, Line 42, replace "in-phase signal 1081" with --in-phase signal 108I--.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*